United States Patent [19]
Gray

[11] Patent Number: 4,531,799
[45] Date of Patent: Jul. 30, 1985

[54] ELECTRICAL CONNECTOR

[75] Inventor: George G. Gray, Mattapoisett, Mass.

[73] Assignee: Raytheon Company, Lexington, Mass.

[21] Appl. No.: 586,653

[22] Filed: Mar. 9, 1984

Related U.S. Application Data

[63] Continuation of Ser. No. 336,759, Jan. 4, 1982, abandoned.

[51] Int. Cl.³ .......................................... H01R 13/631
[52] U.S. Cl. .............................. 339/75 M; 339/255 R
[58] Field of Search ................ 339/75 R, 75 M, 18 R, 339/255 R; 324/158 F

[56] References Cited

U.S. PATENT DOCUMENTS

| | | | |
|---|---|---|---|
| 2,742,626 | 4/1956 | Collins et al. | 339/255 R |
| 2,903,529 | 9/1959 | Hawthorn | 339/75 M |
| 3,654,585 | 4/1972 | Wickersham | 324/158 F |
| 3,678,442 | 7/1972 | Cope et al. | 339/255 R |
| 3,970,934 | 7/1976 | Aksu | 324/158 F |
| 4,168,873 | 9/1979 | Luna | 339/255 R |
| 4,179,171 | 12/1979 | Shannon | 339/75 M |

FOREIGN PATENT DOCUMENTS

| | | | |
|---|---|---|---|
| 2707900 | 8/1978 | Fed. Rep. of Germany | 324/158 F |
| 2729179 | 1/1979 | Fed. Rep. of Germany | 339/255 R |
| 1233309 | 5/1971 | United Kingdom . | |
| 1245781 | 9/1971 | United Kingdom . | |
| 1364109 | 8/1974 | United Kingdom . | |
| 1454918 | 11/1976 | United Kingdom | 339/255 R |

Primary Examiner—John McQuade
Attorney, Agent, or Firm—Martin M. Santa; Joseph D. Pannone; Richard M. Sharkansky

[57] ABSTRACT

A pneumatically controlled electrical test connector contains spring loaded pins whose ends are brought into electrical contact with the opposing ends of corresponding connector pins of an electronic module. The pins of the pneumatically controlled connector have recesses in one of their ends to center the ends of the module connector pins. Pneumatic cylinders produce substantial force between the opposing pins of the test and module connectors to thereby cause good electrical contact at the contacting pin ends. The spring on each pin accommodates the mechanical tolerances of the pin lengths and causes the force on each pin to be substantially equal. Commercially available connectors are slipped onto the other ends of the test connector pins for wiring of the test connector to a test set.

10 Claims, 4 Drawing Figures

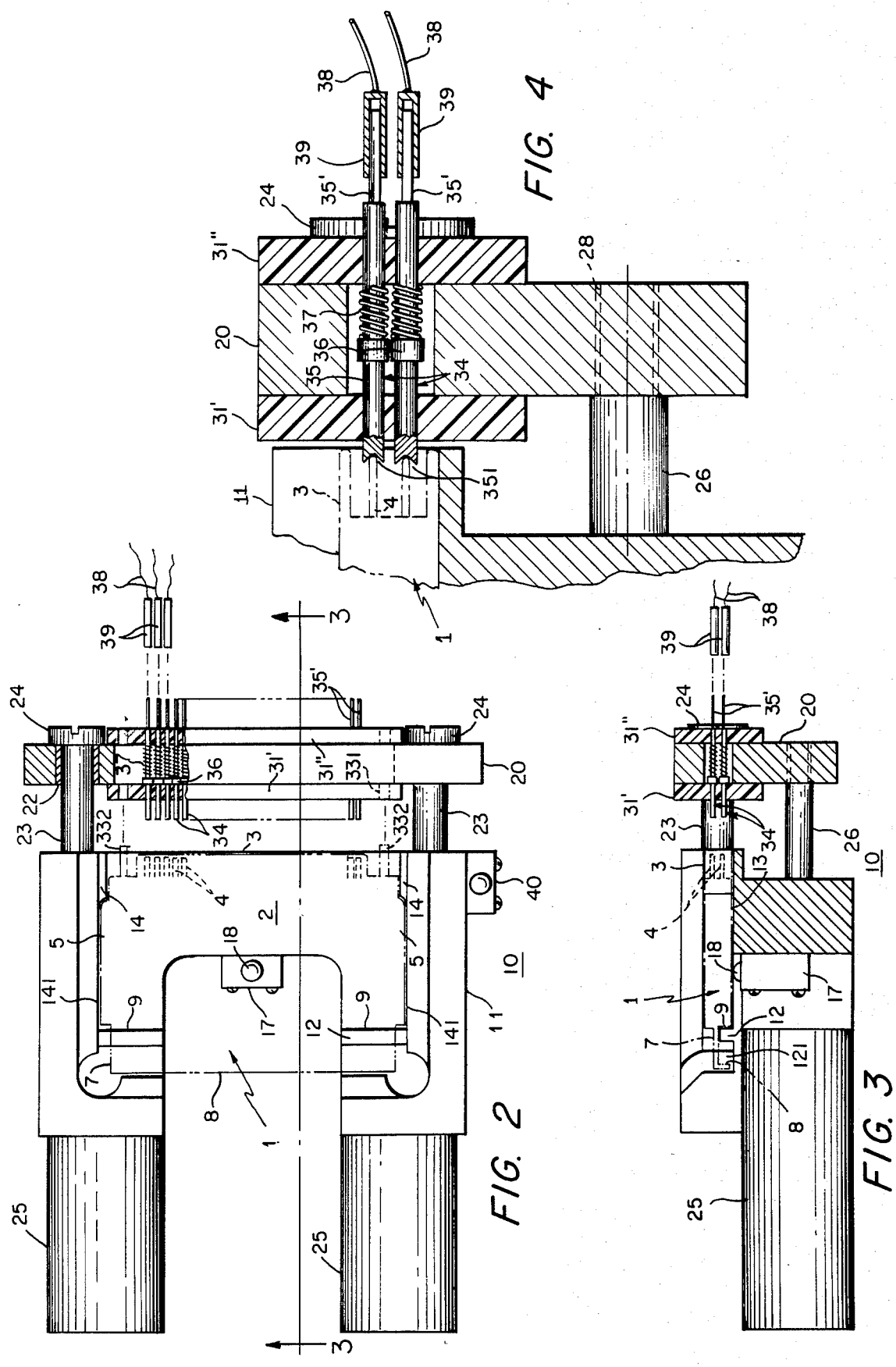

ELECTRICAL CONNECTOR

This application is a continuation of application Ser. No. 336,759 filed Jan. 4, 1982, now abandoned.

BACKGROUND OF THE INVENTION

This invention relates to electrical connectors and more particularly to an electrical connector which has an extended lifetime for production testing of electrical circuits having a fixed set of electrical contacts. The electrical connector of the invention connects the circuit to an automated testing device. A commonly used connector which is attached to printed circuit boards is of a type which has blades which extend for insertion into some form of pressure contact in a mating connector. An example is the female connector provided with a commercially available test set where the connector consists of individual "tuning fork" contacts which mate with the spade type terminals of the connector attached to the printed circuit board. This type of female connector has an advertised lifetime of 500 cycles which lifetime is governed primarily by the wiping contact wear on the tuning fork.

The limited life of this standard female connector requires that the connector be changed every few days. This requirement results in considerable labor costs and test set unavailability. Additionally, and perhaps more important, before the standard connector actually fails, random intermittent problems arise which are difficult to isolate and result in increased trouble shooting labor costs.

Another undesirable feature of existing test set connectors is that the module to be tested is inserted manually. The difficulties of manual insertion limit the test set capability to less than 1000 units per eight hour shift because the high insertion and removal forces result in operator fatigue and possibly even hand injury. Hand insertion also results in the operators tending to "wiggle" the module when inserting and removing the module from its test connector which results in pin damage.

Attempts to replace the standard tuning fork type of connector contacts have been made using commercially available "Pogo Pins". The pogo pins have spring loaded plungers which contact the ends of the module terminals upon insertion. The primary advantage of this concept is that insertion and removal force is substantially less than for the tuning fork connector which results in decreased operator fatigue and module connector damage. The disadvantages with the pogo pin type of connector is that the low axial plunger force (less than 2 ounces) results in high and nonrepeatable contact resistance. Further, the pogo pin design uses a plunger spring and barrel which design results in a higher resistance path. The density of the pin components on the connector is such that small pin components are required. Therefore, they are easily bent and damaged.

Another approach for a test set connector works on the principal of inserting the module terminals into a receptacle followed by clamping the terminal pins by turning a dial or moving a lever. Although this technique minimizes connector wear and has low insertion/removal forces, it is difficult, if not impossible, to attain a low contact resistance. The absence of contact wiping coupled with low clamping force because of size constraints makes this approach unattractive.

It is therefore an object of this invention to eliminate the deficiencies of the prior art connectors by providing a connector which has low contact resistance, which produces minimum operator fatigue, and which has an extended lifetime requiring little "downtime" for maintenance.

SUMMARY OF THE INVENTION

The aforementioned objects and advantages are provided by apparatus in accordance with this invention in which pneumatic cylinders have their pistons connected to a slide carrying electrical connecting pins. The pins have ends which are cupped to engage the ends of the pins of a standard electrical connector connected to the printed circuit board of a standard electronic module to be tested. The standard electric connector is accurately positioned in a frame with respect to the slide so that the pins of the slide are aligned with the pins of the connector. The pins of the slide are individually mounted within springs which are compressed when pin-to-pin end contact is made by moving the slide by the pistons of the pneumatic cylinders. The slide is mounted on precision screws to provide the required alignment accuracy. The desired pressure on the pin ends is determined by the regulated air pressure applied to the cylinders. The springs acting on each pin individually equalize the pressure on each pin removing the effects of difference in pin length caused by manufacturing tolerances.

BRIEF DESCRIPTION OF THE DRAWINGS

The aforementioned aspects and other features of the invention are presented in the following description taken in conjunction with the accompanying drawings, wherein:

FIG. 2 is a top view in partial cross-section of the assembled connector;

FIG. 3 is a sectional view of FIG. 2 shown along section line 3; and

FIG. 4 is an expanded view of a portion of FIG. 3 modified to show the connector pins of the connector of the invention in spring compression contact with the pins of a module.

DESCRIPTION OF THE PREFERRED EMBODIMENT

Figure 1:
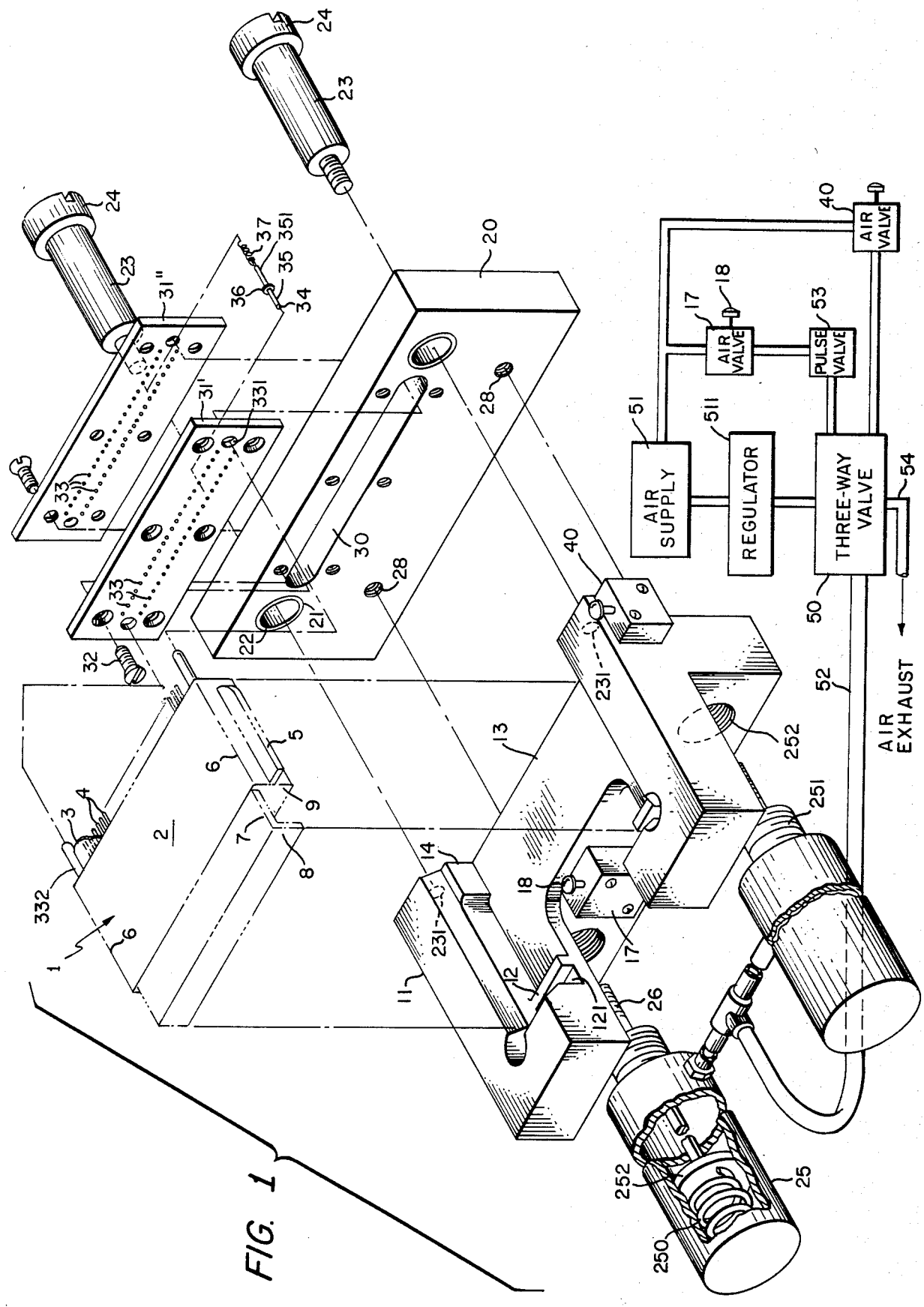
FIG. 1 is an exploded view of the pneumatic connector of the invention.

A preferred embodiment of this invention is shown in an exploded view in FIG. 1 and in assembled views of FIGS. 2–4. The test connector 10 of the invention comprises a module support member 11 adapted to support a standard electronic module 1 such as described in U.S. Pat. No. 4,441,140. The standard electronic module 1 has a body portion or holder 2 in which a printed circuit board is secured. A standard connector having pins 4 is attached to the circuit board. The module has a pair of guides 5 on each side 6, a pair of pin protectors 3, and an extractor portion 7 which extends beyond the body 2 of the module, all as described in detail in the referenced application.

The test connector 10 is comprised of a support member 11 which has a bed 13 upon which the body 2 of the module may rest. The bed 13 is adapted to receive the module 1 in only one orientation. At one end, bed 13 has a vertical projection 12 forming a slot 121 adapted to receive the downwardly projecting portion 8 of the extractor 7 portion of module 1. The bed 13 has transverse projections 14 at its other end which serve as a mechanical stop for guides 5 of the module 1.

Another portion of the test connector 10 is the slide portion 20. The slide portion has a pair of guide holes 21 into which self-lubricating bushings 22 have been fitted. The slide 20 is slidably connected to support 11 by precision shoulder screws 23 which pass through bushings 22 and are screwed into support 11 at screw holes 231. The slide 20 is thus capable of sliding between the support 11 and the shoulder 24 of screw 23. The slide is also attached at screw holes 28 to the threaded piston shafts 26 of a pair of air cylinders 25 which are attached to the support 11. The cylinders 25 are secured to the threaded hole 252 of mount 11 such that the piston shaft 26 of the cylinder 25 is parallel to the longitudinal axes of the precision screws 23.

The slide 20 has a slot 30 which extends transversely between the screws 23 and longitudinally through the slide to form an elongated hole in the direction of slide 20 sliding movement along screws 23. Electrically insulating headers 31', 31'' typically one-sixteenth inch glass fiber sheeting, are mounted by mounting screws 32 on both sides of slide 20 to cover slot 30. The headers 31', 31'' have pin aligning holes 33 which holes, when headers 31', 31'' are mounted on slide 30, are in alignment with the connector pins 4 of the electronic module 1. The headers 31', 31'' also have clearance holes 331 which allow the keyed pins 332 of the module to pass through the header 31'. As seen in FIG. 2 as slide 20 approaches module 2, the pins 332 enter hole 331 and thereby prevent the module 2 from moving transversely to its plane because of the pressure contact of the pins 4 and 34. Mounted in the holes 33 and extending beyond the headers 31', 31'' are contact pins 34. The pin 34 is preferably made of beryllium copper which has the desirable properties of hardness and good electrical conductivity. Each pin has a body 35 of substantially the same diameter as hole 33 and capable of sliding within hole 33. A shoulder 36 larger in diameter than the body 35 prevents the pin 34 from completely sliding through hole 33. A spring 37 slides over the body portion 35' and is stopped by shoulder 36. The contact pin 34 when assembled between headers 31' and 31'' and inside slot 30 has its shoulder 36 pressed against the header 31' by spring 37. The other end of spring 37 is pressed against header 31''. Sliding electrical contact to pin 34 is made by reducing the diameter of pin body 35 at the end 35' to a diameter which allows a commercially available connector 39 to be used. The connectors 39 have electrical leads 38 through which electrical contact of the pins 4 of module 1 is made to a test set (not shown).

Normally closed air switch 17 is connected to pulse valve 53 which is connected to 3-way air valve 50. The air valve 50 connects an air supply 51 through regulator 511 to the cylinders 25 through tube 52 in response to activation of switch 17. Activation of air valve 40 causes the air valve 50 to exhaust the air contained in cylinders 25 through the tubes 52 and 54. The cylinder 25 contains a piston 252 and a spring 253.

FIG. 2 shows a top plan view of the assembled connector mechanism 10 of FIG. 1 in which a portion of the module 1, depicted by dashed lines, is shown resting on bed 13. Guides 5 of module 1 are in contact with stops 14 of support 11. The extension 7 is seen to extend over the rib 12. The module 1 fits snugly between the sides 141 of frame support 11 when resting on bed 13, its pins 4 being in vertical and lateral alignment with corresponding pins 34 of slide 20. The back edge 9 of module 1 is seen to be closely spaced from rib 12. FIG. 2 shows the slide 20 in its most remote position relative to support 11 which occurs when the cylinders 25 are not activated by air from supply 51, but instead spring 253 is pushing a piston 252 to cause shaft 26 to push slide 20 out against the heads 24 of screws 23.

FIG. 3 shows a cross-sectional view of FIG. 2 along the section line 3 and illustrates more clearly the placement of the module 1 on the bed 13. The back edge 9 of the module is shown adjacent the ridge 12. FIG. 3 also shows the downwardly projecting portion 8 of the module 1 extending into the slot 121 with the module extension 7 extending over the top of the ridge 12. FIG. 3 also shows clearly that the pins 34 of slide 20 are parallel to the plane of module 1. FIG. 4 shows that the pins 34 move parallel to the plane of module 1 to make end contact with the pins 4.

FIG. 4 is an expanded view of a portion of FIG. 3 which shows in more detail the contact of connector pins 4 of module 1 to the ends 351 of the pins 34 of slide 20. The connection is made by pressure contacts of the ends of the pins 4, 34 with the pressure being provided by the partially compressed springs 37. Springs 37 are compressed by the movement of slide 20 toward support 11 by the retraction of piston rods 26 caused by the application of air pressure to cylinders 25 from supply 50 through valve 50 by the actuation of air switch 17 attached to the support member 11. The actuating button 18 of the air switch 17 projects above the surface of the bed 13 to make contact with a module 1 when properly inserted on bed 13 of support 11.

In the operation of the test set connector 10, the module 1 to be tested is placed on the bed 13 of support 11 and rests upon the control button 18 of air switch 17. The module 1 is oriented so that its pins 4 are in the direction of the slide 20. The shoulder 14 of support 11 acts as a stop for guides 5 to prevent the module 1 from being improperly inserted on bed 13 in a position too close to slide 20. The asymmetrical mechanical configuration of the extended portion 7 of the module 1 is such that the module 1 will seat on bed 13 only when the downwardly directed portion 8 can drop into slot 121. This arrangement allows module 1 to be correctly oriented before it may be tested.

After inserting the module 1 in the correct position in support 11, the operator applies finger pressure in a downward direction on the module 1 which causes the module 1 to depress the switch button 18 of the switch 17. Closing switch 17 provides air pressure from supply 51 to pulse valve 53 which provides a single pulse of air to 3-way air valve 50 which then allows air to flow from regulator 511 of supply 51 through pipe 52 to cylinders 25. The air pressure from supply 51 causes the piston 252 and shaft 26 of cylinder 25 to retract into the cylinder pulling slide 20 toward support 11. Movement of the slide 20 also causes the ends 351 of pins 34 to make contact with the ends of pins 4 of the module 1 as shown in FIG. 4. The module 1 is constrained from moving by the ridge 12 which engages the back edge 9 of module 1. Movement of the slide 20 subsequent to the time that the pins 34 meet the pins 4 causes compression of spring 37. The pressure provided by air supply 51 through regulator 511 to the air cylinders 25 and the elastic constant of the springs 37 are chosen so that the desired amount of mechanical pressure on each pin 4 is obtained when spring 37 is approximately compressed to half the distance between the headers 31', 31''. Typically, the spring 37 will compress one eighth inch with one pound of force; therefore, each cylinder 25 exerts about twenty pounds of force. The compression springs 37 provide accommodation for differences in length of the terminal pins 4 or contact pins 34.

The end 351 of contact pin 34 which makes electrical connection to the end of terminal pin 4 of the module is concave to provide a self-aligning capability for the contact pin 34. The opposite end 35' of contact pins 34 is reduced in diameter to fit into a commercially available connector 39. Electrical conductors 38 of the electrical connector 39 to provide direct electrical connection between the test set (not shown) and the module 1 under test.

After actuation of the air cylinders 25 causes electrical connection to be made between the test set and the module 1, the operator causes the test set to commence testing. Upon completion of testing, as indicated by a signal from the test set, the operator actuates the air switch 40 which actuates the air valve 50 to close off the air supply to line 52 from regulator 511 and to allow the air within the cylinder 25 to escape through line 54 to the atmosphere. With the release of air pressure, the spring 253 contained within the cylinder 25, causes the slide 20 to be pushed away from the module 1 under test and to remove contact between contact pins 34 and the module pins 4. With the release of the contact pin 34 pressure, the module 1 may be removed from the support member 11 and an indication placed thereon as to whether the module has passed or failed the test.

It will be apparent to those skilled in the art that the signal provided by the test set as to whether the module has passed or not passed can be used to actuate air cylinders (not shown) which provide an appropriate marking stamp on the test module prior to its being released by switch 53. It will also be apparent that the test set could provide a signal after completion of testing which would actuate the air valve 50 to remove the pressure from the air cylinders 25.

It will be further apparent that the invention may be used with any connector connected to wires onto a printed circuit board without being part of a module. The support member and the bed upon which the connector rests need only be compatible with the particular connector and the structure to which the connector is attached. The connector needs only to have pins which are strong enough to withstand moderate end pressure, e.g., one pound, without bending; the pressure being adequate to provide good electrical contact with the test connector of the invention.

Having described a preferred embodiment of the invention it will now be apparent to one of skill in the art that other embodiments incorporating its concept may be used. It is felt, therefore, that this invention should not be restricted to the disclosed embodiment but rather should be limited only by the spirit and scope of the appended claims.

What is claimed is:

1. Apparatus for making electrical contact to a connector means comprising:
   a connector means;
   a substantially planar holder means;
   a mounting frame;
   a circuit board having at one end said connector means which has a plurality of first pins in a fixed position parallel to the plane of said holder means and to each other;
   said holder means having said circuit board secured thereto;
   a slide connected to said frame, said slide having a plurality of electrically conducting second pins mounted in said slide, said second pins in electrical isolation from each other and parallel to the plane of said holder means;
   each of said second pins having a resilient mounting means to allow resilient second pin movement in the longitudinal direction of said second pins;
   said connector means being secured to said circuit board so that the first pins of said connector means are laterally and longitudinally aligned with the second pins of said slide when said holder means is in said frame;
   means for moving said slide relative to said connector means in a direction so that the ends of the second pins of said slide make pressure contact in the longitudinal direction of said first and second pins with the ends of the first pins of said connector means; and
   said mounting frame and said slide preventing said holder means from moving longitudinally and transversely to the plane of said holder means, respectively, while said pressure contact is applied, to maintain said holder in a fixed position in said frame.

2. The apparatus of claim 1 wherein said frame contains a recess; and
   said recess being adapted to hold said connector means in said fixed position so that the electrical connector pins of said connector means are in alignment with the respective second pins of said slide.

3. The apparatus of claim 1 wherein the ends of each of the second pins of the slide are concave and the ends of each of the pins of the connector means are convex to cause mating of the ends of corresponding pins of the slide and connector means when in contact with each other.

4. The apparatus of claim 1 wherein said means for moving said slide comprises:
   a pair of pneumatic cylinders connected to the ends of said slide;
   a regulated air supply;
   means for applying said supply to said cylinders to cause said pins of said slide to have their ends come into contact with the ends of the pins of said connector means and to cause said slide pins to move longitudinally against their respective resilient mounting means.

5. The apparatus of claim 1 wherein:
   said slide has at least one hole;
   said holder has at least one pin mating with said hole when said slide has been moved by said moving means to a position where there is pressure contact of said first and second pins, said mating preventing transverse movement of said holder with respect to its plane.

6. A connecting mechanism for making electrical connections to the pins of an electrical connector forming a part of an electronic module comprising:
   a frame having a recess for holding in said recess a module containing a circuit board having a connector with first pins;
   slide means holding a plurality of second pins, each second pin in lateral and longitudinal alignment with a corresponding one of said connector first pins;

said module being in a plane parallel to said first and second pins when being held in said recess;

means for resiliently mounting each of said plurality of second pins for resilient movement in its longitudinal direction;

each of said plurality of second pins and said connector first pins having their ends concave and convex, respectively;

pneumatic cylinder moving means for causing said slide means and said frame recess to move relative to each other parallel to the plane of said module to cause said module connector first pin ends to make pressure contact with the ends of said second pin ends, said moving means providing sufficient force to cause resilient longitudinal movement of the second pins;

said slide means being adapted to hold said module in a plane parallel to said first and second pins during the time of said pressure contact;

a plurality of electrical conductors; and said plurality of second pins of said slide means having their other ends in electrical connection to said plurality of electrical conductors.

7. The mechanism of claim 6 comprising in addition:

an air supply connected to said pneumatic cylinder means;

said recess accepts only one orientation of said module to allow actuation of said pneumatic cylinder means by said air supply for said one orientation of said module which correctly aligns corresponding pins of said module and said slide means.

8. The mechanism of claim 6 wherein said means for resiliently mounting said plurality of second pins comprises:

a pair of electrically insulating headers, each having a plurality of holes, said headers being mounted to said slide means, said holes of each header being aligned with said connector pins, said plurality of second pins being electrically isolated from each other and mounted partially between said headers and protruding partially through said header holes;

each of said plurality of second pins having a collar greater in diameter than the holes in said headers through which each pin protrudes; and a spring on each of said plurality of second pins between said collar and one of said headers, said plurality of second pins having said concave ends nearer said collar than said spring.

9. The mechanism of claim 8 wherein:

said pneumatic cylinder moving means comprises a pair of pneumatic cylinders each connected to one end of said slide means;

a source of pressurized air;

air valve means responsive to one orientation of said module in said recess of said frame to allow flow of air from said pressurized air source to said cylinders to move said slide means; and means for removing said air from said cylinders to remove said force from said second pins and to allow said module to be removed from said frame.

10. The apparatus of claim 6 wherein:

said slide means has at least one hole;

said module has at least one pin mating with said hole when said slide means has been moved by said moving means to a position where there is pressure contact of said first and second pins, said mating preventing transverse movement of said module with respect to its plane.

* * * * *